United States Patent
Griffith et al.

(10) Patent No.: US 7,808,413 B2
(45) Date of Patent: Oct. 5, 2010

(54) SYSTEM AND METHOD FOR PROCESSING SIGNALS FROM MULTIPLE INPUT DEVICES

(75) Inventors: Scot Griffith, Glendale, AZ (US); Jef Sloat, Glendale, AZ (US); Richard May, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 98 days.

(21) Appl. No.: 12/358,961

(22) Filed: Jan. 23, 2009

(65) Prior Publication Data

US 2010/0188276 A1 Jul. 29, 2010

(51) Int. Cl.
*H03M 1/00* (2006.01)
(52) U.S. Cl. ............... 341/141; 341/155; 341/156
(58) Field of Classification Search ............ 341/141, 341/155, 156
See application file for complete search history.

(56) References Cited

U.S. PATENT DOCUMENTS

| 4,479,240 A * | 10/1984 | McKinley, Jr. ............ 381/80 |
|---|---|---|
| 5,083,288 A | 1/1992 | Somlyody et al. |
| 5,107,146 A | 4/1992 | El-Ayat |
| 5,257,190 A | 10/1993 | Crane |
| 5,291,197 A | 3/1994 | Abe |
| 5,884,224 A | 3/1999 | McNabb et al. |
| 6,281,830 B1 | 8/2001 | Flety |
| 6,509,758 B2 | 1/2003 | Piasecki et al. |
| 6,593,865 B2 * | 7/2003 | Nestler et al. ............ 341/141 |
| 6,667,692 B2 | 12/2003 | Griffin |
| 6,830,650 B2 | 12/2004 | Roche et al. |
| 7,124,632 B2 | 10/2006 | Smith |
| 7,171,542 B1 | 1/2007 | Alfano et al. |
| 2004/0027263 A1 * | 2/2004 | Pailleur et al. ............ 341/141 |
| 2008/0143387 A1 | 6/2008 | Lin |

* cited by examiner

*Primary Examiner*—Jean B Jeanglaude
(74) *Attorney, Agent, or Firm*—Ingrassia Fisher & Lorenz, P.C.

(57) ABSTRACT

Systems and methods for processing a plurality of input signals are provided. A plurality of selection signals are received. Each of the plurality of selection signals is representative of one of a plurality of input signal characteristics. Each of the input signal characteristics is associated with one of the plurality of input signals. The plurality of input signals are converted into at least one digital waveform. A plurality of signal values may be extracted from the at least one digital waveform based on the plurality of input signal characteristics. An output signal may be generated based on each of the plurality of signal values.

20 Claims, 3 Drawing Sheets

SYSTEM AND METHOD FOR PROCESSING SIGNALS FROM MULTIPLE INPUT DEVICES

TECHNICAL FIELD

The present invention generally relates to electronic systems, and more particularly relates to systems and methods for processing input signals from multiple input devices.

BACKGROUND

Various types of electronic equipment are used to perform system control functions, signal processing, etc., in many industries, such as the aerospace industry. Any such system may be required to interface with a wide variety of input and output devices. Often, the interface requirements change from one application to the next, resulting in costly and time consuming design of multiple electronic control devices, as well as multiple signal conditioning and demodulation circuits, which confine an input signal path to a specific type of input.

Accordingly, it is desirable to provide a system and method for processing signals that may be used with multiple types of input devices without the need for specialized circuitry for interfacing with each of the devices. Furthermore, other desirable features and characteristics of the present invention will become apparent from the subsequent detailed description and the appended claims, taken in conjunction with the accompanying drawings and the foregoing technical field and background.

BRIEF SUMMARY

In one embodiment, a method for processing a plurality of input signals is provided. A plurality of input signals are received. Each of the plurality of input signals is generated by a respective input signal device. The plurality of input signals are converted into at least one digital waveform based on a plurality of input signal characteristics. Each of the plurality of input signal characteristics is associated with one of the plurality of input signals.

In another embodiment, a method for processing a plurality of input signals is provided. A plurality of selection signals are received from a user. Each of the plurality of selection signals is representative of one of a plurality of input signal characteristics. Each of the input signal characteristics is associated with one of the plurality of input signals. The plurality of input signals are converted into at least one digital waveform. A plurality of signal values are extracted from the at least one digital waveform based on the plurality of input signal characteristics. An output signal is generated based on each of the plurality of signal values.

In a further embodiment, a machine-readable medium is provided. The machine-readable medium has a set of instructions stored thereon that when performed by a machine causes the machine to perform a method. A plurality of input signal characteristics are received from a user. Each of the plurality of input signal characteristics is associated with one of a plurality of input signals. A plurality of signal values are extracted from at least one digital waveform based on said received plurality of input signal characteristics. Each of the plurality of signal values is associated with one of the plurality of input signals.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, and brief summary or the following detailed description. It should also be noted that FIGS. 1-3 are merely illustrative and may not be drawn to scale.

Systems and methods in accordance with various aspects of the present invention provide an improved signal processing schemes. In this regard, the present invention may be described herein in terms of functional block components and various processing steps. It should be appreciated that such functional blocks may be realized by any number of hardware, firmware, and/or software components configured to perform the specified functions.

For example, the present invention may employ various integrated circuit components, such as memory elements, digital signal processing elements, look-up tables, databases, and the like, which may carry out a variety of functions under the control of one or more microprocessors or other control devices. Such general techniques and components that are known to those skilled in the art are not described in detail herein.

Figure 1:
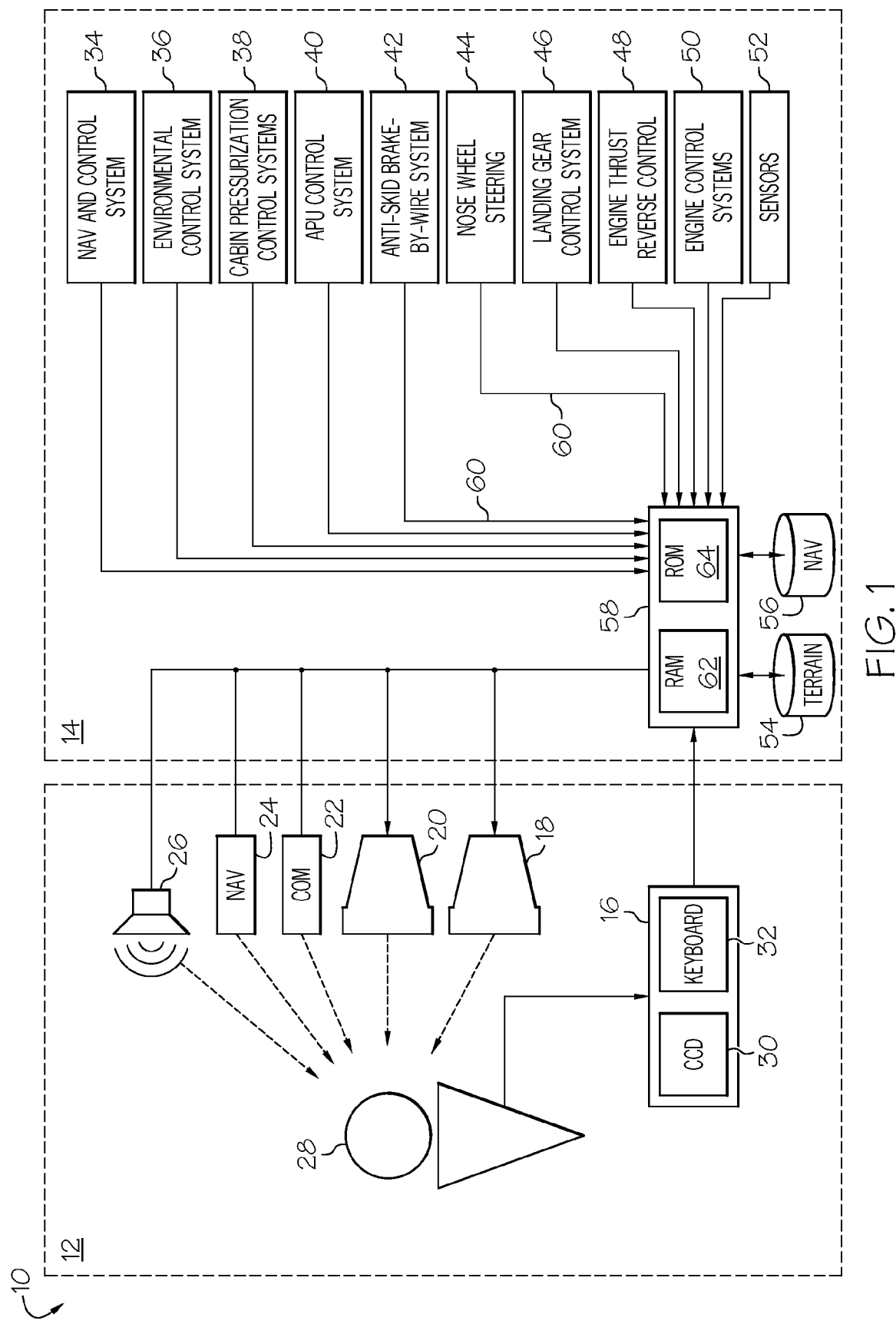
FIG. 1 is a block diagram schematically illustrating an vehicle according to one embodiment of the present invention.
Figure 2:
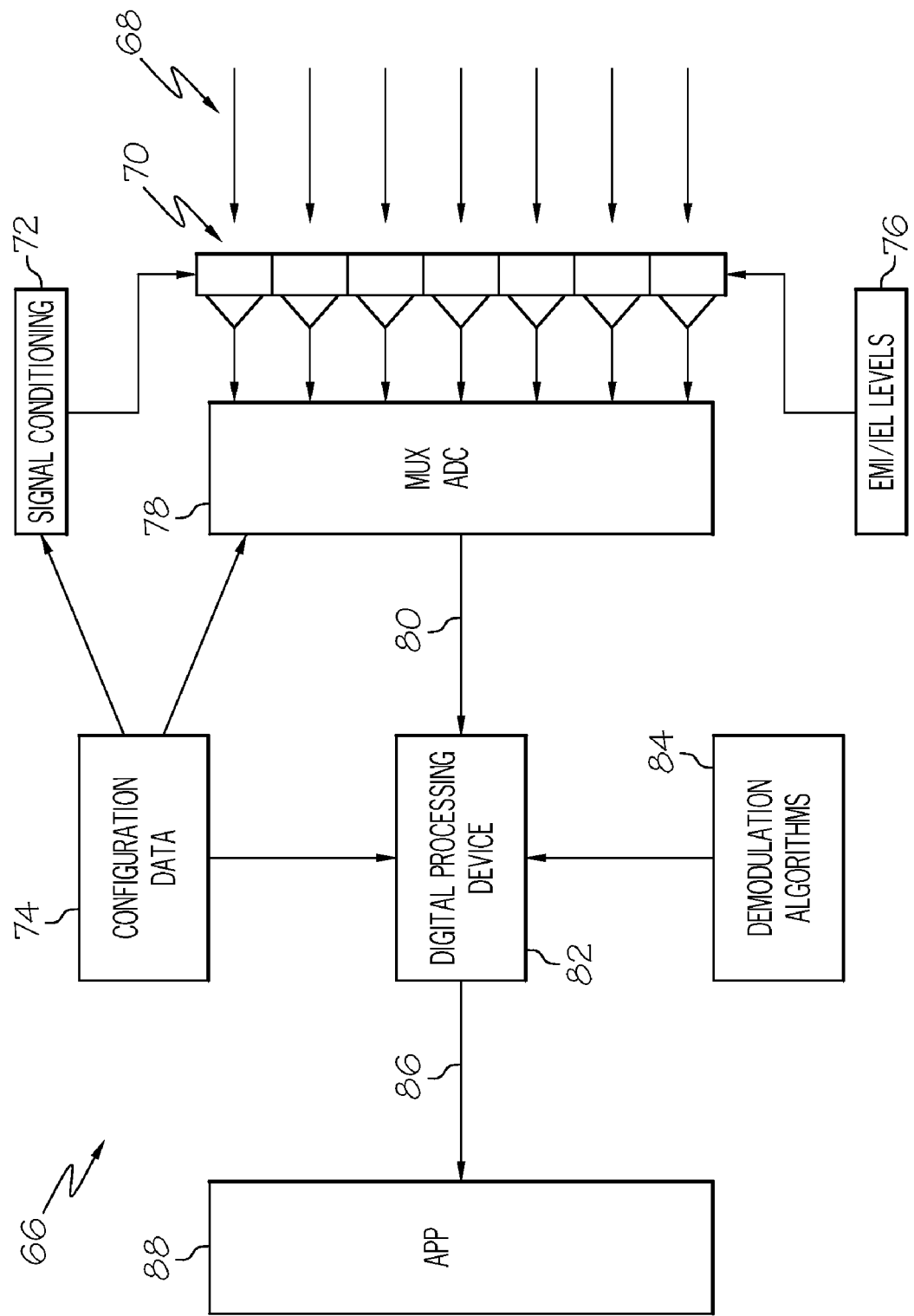
FIG. 2 is a block diagram of a system and/or method for processing input signals according to one embodiment of the present invention.
Figure 3:
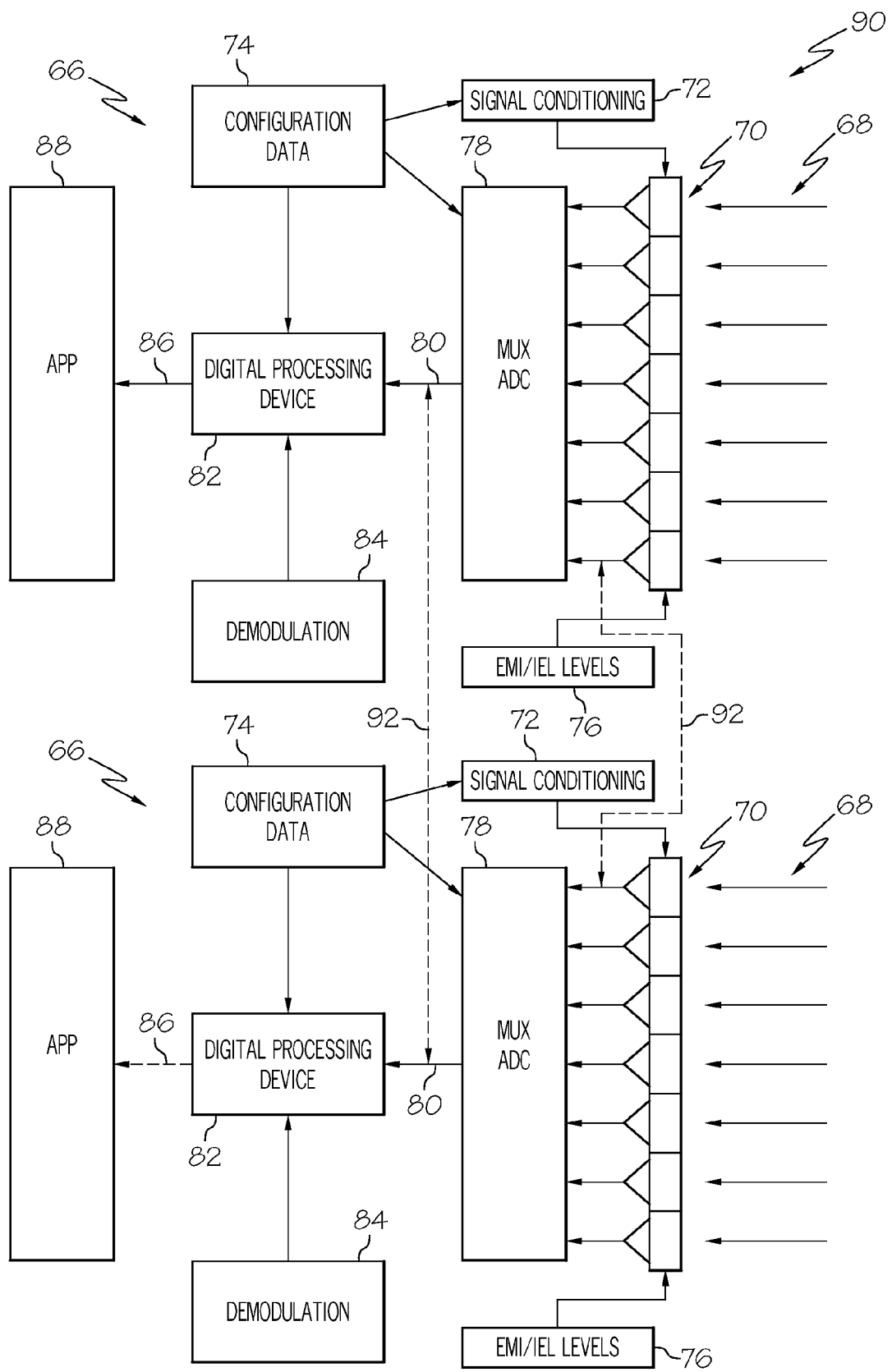
FIG. 3 is a block diagram of a redundancy scheme utilizing the system and/or method of FIG. 2.

FIG. 1 to FIG. 3 illustrate systems and methods for processing signals. In general, a plurality of input signals are received. Each of the plurality of input signals is generated by a respective input signal device. The plurality of input signals are converted into at least one digital waveform based on a plurality of input signal characteristics. Each of the plurality of input signal characteristics is associated with one of the plurality of input signals.

The plurality of input signals may each be generated by an avionics system device and at least some of the plurality of input signals are analog input signals. The plurality of input signals may include a first number of input signals, and the converting of the plurality of input signals into the at least one digital waveform may include multiplexing the plurality of input signals into a second, lesser number of digital waveforms.

A plurality of signal values may be extracted from the at least one digital waveform based on the plurality of input signal characteristics. The at least one digital waveform may be encoded based on the plurality of input signal characteristics. The encoding of the at least one digital waveform based on the plurality of input signal characteristics may include modulating the at least one digital waveform according to a plurality of modulation algorithms. Each of the plurality of modulation algorithms may be associated with one of the plurality of input signals.

FIG. 1 schematically illustrates a vehicle 10, such as an aircraft, in which the method and system described below may be implemented, according to one embodiment of the present invention. The vehicle 10 may be, in one embodiment, any one of a number of different types of aircraft such as, for example, a private propeller or jet engine driven airplane, a commercial jet liner, or a helicopter. In the depicted embodiment, the vehicle 10 includes a flight deck 12 (or cockpit) and an avionics/flight system 14. Although not specifically illustrated, it should be understood that the vehicle 10 also includes a frame or body to which the flight deck 12 and the avionics/flight system 14 are connected, as is commonly understood. It should also be noted that vehicle 10 is merely exemplary and could be implemented without one or more of the depicted components, systems, and data sources. It will additionally be appreciated that the vehicle 10, the flight deck, and/or the avionics/flight system 14 could be implemented with one or more additional components, systems, or data sources.

As shown in FIG. 1, the flight deck 12 includes a user interface 16, display devices 18 and 20 (e.g., a display screen for a flight management system (FMS) and a primary flight display (PFD)), a communications radio 22, a navigational radio 24, and an audio device 26. The user interface 16 is configured to receive manual input from a user 28 and, in response to the user input, supply command signals to the avionics/flight system 14. It should be understood that the user 28 may refer to various types of personnel, such as a pilot or crewperson or a technician or other maintenance engineer.

The user interface 16 may be any one, or combination, of various known flight control devices and user interface/text entry devices including, but not limited to, a cursor control device (CCD), such as a mouse, a trackball, or joystick, and/or a keyboard, one or more buttons, switches, or knobs. As such, the user interface 16 may include a text entry device comprising any device suitable to accept alphanumeric character input from user 28 and convert that input to alphanumeric text on the displays 18 and 20. In the depicted embodiment, the user interface 16 includes a CCD 30 and a keyboard 32. The user 28 uses the CCD 30 to, among other things, move a cursor symbol on the display devices 18 and 20, and may use the keyboard 32 to, among other things, input textual data.

Still referring to FIG. 1, the display devices 18 and 20 are used to display various images and data, in graphic, iconic, and/or textual formats, and to supply visual feedback to the user 28 in response to user input commands supplied by the user 28 to the user interface 16. One or more of the displays 18 and 20 may further be a control display unit (CDU), a multi-function control display unit (MCDU), or a graphical display. It will be appreciated that the display devices 18 and 20 may each be implemented using any one of numerous known displays suitable for rendering image and/or text data in a format viewable by the user 28, such as a cathode ray tube (CRT) displays, a LCD (liquid crystal display), a TFT (thin film transistor) displays, or a heads up display (HUD) projection.

The avionics/flight system 14 includes a navigation and control system (or subsystem) 34, an environmental control system (ECS) 36, a cabin pressurization control system (CPCS) 38, an auxiliary power unit (APU) control system 40, an anti-skid brake-by-wire system 42, a nose wheel steering system 44, a landing gear control system 46, an engine thrust reverse control system 48, various other engine control systems 50, a plurality of sensors 52, one or more terrain databases 54, one or more navigation databases 56, and a processor 58. The various components of the avionics/flight system 14 are in operable communication via sensor inputs (e.g., analog sensor inputs) 60 (or a data or avionics bus).

Although not illustrated, the navigation and control system 34 may include a flight management system (FMS), a control display unit (CDU), an autopilot or automated guidance system, multiple flight control surfaces (e.g., ailerons, elevators, and a rudder), an Air Data Computer (ADC), an altimeter, an Air Data System (ADS), a Global Positioning Satellite (GPS) system, an automatic direction finder (ADF), a compass, at least one engine, and gear (i.e., landing gear).

As is commonly understood, the ECS 36 and the CPCS 38 may control the air supply and temperature control, as well as the cabin pressurization, for the flight deck 12 (and the passenger compartment) of the vehicle 10. The ECS 36 may also control avionics cooling, smoke detection, and fire suppression systems.

The APU control system 40 manages the operation of an APU (not shown), which provides power to various systems of the vehicle 10 (e.g., other than propulsion). The anti-skid brake-by-wire system 42 controls the wheel brakes (not shown) during take off and landing so as to prevent the wheel from losing traction with the ground. The nose wheel steering system 44 and the landing gear control system 46 control (e.g., in combination with input from the user 28) the landing gear to provide both direction control of the vehicle 10 when on the ground and raise and lower the landing gear during take off and landing approach.

The engine thrust reverse control system 48 and other engine control systems 50 manage the operation of the engines during all stages of operation (e.g., take-off, in flight, and during landing). Although not illustrated, the sensors 52 may include, for example, a barometric pressure sensor, a thermometer, and a wind speed sensor.

The processor 58 may be any one of numerous known general-purpose microprocessors or an application specific processor that operates in response to program instructions. In the depicted embodiment, the processor 58 includes on-board random access memory (RAM) 62 and on-board read only memory (ROM) 64. The program instructions that control the processor 58 may be stored in either or both the RAM 62 and the ROM 64. For example, the operating system software may be stored in the ROM 64, whereas various operating mode software routines and various operational parameters may be stored in the RAM 62. It will be appreciated that this is merely exemplary of one scheme for storing operating system software and software routines, and that various other storage schemes may be implemented. It will also be appreciated that the processor 58 may be implemented using various other circuits, not just a programmable processor. For example, digital logic circuits and analog signal processing circuits could also be used.

According to one aspect of the present invention, input signals are received from various components and subsystems on-board the vehicle 10, such as those shown in FIG. 1, and fed into the avionics system using, for example, a generic interface. The input signals may be analog or digital signals. In one embodiment, at least some, or all, of the input signals are analog signals. Each of the input signals are encoded (e.g., sampled at a particular rate) based on configuration data (and/or input signal characteristics) provided by a user (e.g., a technician) and converted into a digital waveform (e.g., one digital waveform for each input signal). In one embodiment, however, the input signals are multiplexed into a single digital waveform. The one or more digital waveforms are then demodulated according to suitable demodulation algorithms or schemes that are associated with the particular components or subsystems of the vehicle 10 to extract signal values (e.g., values representative of the readings from the components or other data from the subsystems). Output signals are generated based on the signal values and provided to one or more applications, which utilize the output signals in various ways, such as controlling a system or displaying a reading or value on a display device.

FIG. 2 is a block diagram illustrating a system (and/or method) 66 for processing a plurality of input signals, according to one embodiment of the present invention. As will be appreciated by one skilled in the art, the various blocks and/or steps shown in FIG. 2 and described below may be implemented in software, firmware, or circuit components, some of which may be shown in FIG. 1 and referred to above. Referring specifically to FIG. 2, a plurality of input signals 68 are generated by various components and/or subsystems in the vehicle 10. For example, one of the input signals 68 may be a signal generated by the barometric pressure sensor, which is representative of the atmospheric pressure outside of the vehicle 10. Another example of an input signal 68 is a signal representative of the orientation of the landing gear (e.g., "up" or "down"), which is generated by the landing gear control system 46. In one embodiment, at least some of the input signals are analog signals.

As indicated in FIG. 2, the input signals received by the system 66. According to one aspect, the input signals 68 are received by the system 66 through generic input nodes (or signal pins) 70 through the sensor inputs 60 (FIG. 1). As will be appreciated by one skilled in the art, the input signals 68 then undergo signal conditioning 72, such as amplification.

The signal conditioning performed on each of the input signals 68 (or at each of the input nodes 70) may be based on a set of configuration data 74 that is entered into the system 66 by, for example, the user 28 (FIG. 1) prior to use. The configuration data 74 may include selections of the particular type of input signal that is to be received by each of the input nodes 70 (i.e., the type of component or subsystem that is coupled to each of the input nodes 70) and input signal characteristics associated with the selected components and/or subsystems. As such, the signal conditioning performed on each of the input signals 68 may vary, depending on the particular type of input signal 68 that is received at each input node 70. The signal conditioning 72 may also take into account the levels 76 of electromagnetic interference (EMI) and Indirect Effects of Lightning (IEL) experienced by different portions of the sensor inputs (or data bus) 60, as well as the shielding provided to minimize such phenomena.

In the depicted embodiment, the conditioned input signals 68 are then provided to a multiplexed analog-to-digital (MUX ADC) converter 78. The MUX ADC converter 78 converts the multiple input signals 68 into, in one embodiment, a single digital waveform 80. As is commonly understood, the conversion of the analog input signals into the digital waveform may be performed by sampling the input signals 68 at selected frequencies, depending on the particular type of component or subsystem associated with each signal. The signal sampling frequencies used may be between, for example, 10 Hertz (Hz) and 10,000 Hz.

The digital waveform 80 is provided to a digital processing device 82 (e.g., the processor 58 shown in FIG. 1) that extracts a signal value from the digital waveform 80 for each of the input signals 68. The extraction of the signal values is performed utilizing the configuration data 74 (i.e., the selections of the components/subsystems in use). In particular, the processing device 82 uses a stored (e.g., on the ROM 64) collection of demodulation algorithms (or schemes) 84, each of which is associated with a particular type of input signal 68 and/or component/subsystem type and/or sampling rate as stored in the configuration data 74. That is, the processing device 82 demodulates the digital waveform 80 based on the component/subsystem selections stored in the configuration, in a manner similar to the encoding or sampling of the input signals 68 based on the component/subsystem selections.

The processing device 82 is thus able to extract a plurality of signal values from the digital waveform 80, with each of the signal values being associated with one of the input signals 68, or the associated component/subsystem. That is, each of the signal values is indicative of a reading, or other data, that is represented by the input signal 68 from one of the components/subsystems. As previously mentioned, examples of signal values are the atmospheric pressure as sensed by the barometric pressure sensor and the orientation of the landing gear.

The processing device 82 generates output signals 86 that are representative of the signal values and provides them to an application (APP) 88 (e.g., a software program). The application 88 then utilizes the output signal(s) 86 in an appropriate manner. For example, the application 88 may be associated with the control of the various subsystems (e.g., those shown in FIG. 1). As another example, the application 88 may be configured to display information with the display devices 18 and 20, such as the atmospheric pressure, the orientation of the landing gear, etc.

In the event that the components and subsystems deployed in the vehicle 10 are changed, the configuration data may be changed (e.g., by the user 28 to a second set of configuration data) to describe the updated list of components/subsystems on-board the vehicle 10. After such a change, the system 66 may operate in a manner similar to that described above, but utilizing different sets of encoding/sampling and extraction/demodulation schemes that are suitable for the new set of components/subsystems that are being utilized.

In one embodiment of the present invention, the avionics system is provided with a redundant input signal processing scheme (or system and/or method) 90, as illustrated in FIG. 3. In the example shown in FIG. 3, the redundant processing scheme 90 includes two of the systems 66 (e.g., a primary system and a back-up system) that are described above and shown in FIG. 2, and which may be implemented using separate processing devices 82 and memories (e.g., RAM and/or ROM), on which the other components (e.g., 72, 74, 76, 84, and 88) may be stored. In such an embodiment, each of the systems 66 receive the same input signals 68 from the components/subsystems on-board the vehicle 10 and perform virtually the identical signal processing as that described above.

The systems 66 are in operable communication through a dual channel interface 92 through which the systems 66 may share the conditioned input signals 68 and digital waveforms 80. That is, in one embodiment, each of the systems 66 provides its conditioned input signals 68 and/or digital waveform 80 to the other system 66. Although the output signal(s) 86 from only one of the systems 66 may be used (e.g., by an "active" application 88) under normal operating conditions, both systems 66 may simultaneously perform the signal processing, for example, as described above. In the event that the primary system 66 (e.g., the upper of the two systems 66) becomes inoperative, the application 88 for the primary system 66 becomes "inactive," and the application 88 for the back-up system 66 (e.g., the lower of the two systems 66) becomes active and utilizes the output signal(s) 86 generated by the associated processing device 82.

The redundant scheme illustrated in FIG. 3 may also be used to compare the signal conditioning and/or input signal integrity, as well as the digital waveform generation, of the two systems 66. Although FIG. 3 illustrates a single redundancy scheme (i.e., with two systems 66), it should be understood that additional systems 66 coupled through multiple channel interfaces may be provided (e.g., three or more systems 66).

One advantage of the signal processing system and/or method described above is that multiple types of input signals from various types of components and/or subsystems may be processed through generic interfaces. In other words, no specialized circuitry is required for the input signals from the components/subsystems to be converted into digital signals. As a result, the overall cost of the signal processing system is reduced. Another advantage is that because the system performs the encoding/sampling and the extraction/demodulation based on user-provided selections and encoding/decoding schemes stored in memory, the system may be easily re-configured in the event that the components and/or subsystems are changed. A further advantage is that because of the redundant scheme that provided in at least one embodiment, the signal processing system may easily meet the standards set by any regulatory authorities.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for processing a plurality of input signals comprising:
    receiving a plurality of input signals; and
    converting the plurality of input signals into at least one digital waveform based on a plurality of input signal characteristics, each of the input signal characteristics being associated with one of the plurality of input signals.

2. The method of claim 1, wherein the plurality of input signals are each generated by an avionics system device and at least some of the plurality of input signals are analog input signals.

3. The method of claim 1, wherein the plurality of input signals comprise a first number of input signals and the converting of the plurality of input signals into the at least one digital waveform comprises multiplexing the plurality of input signals into a second number of digital waveforms, the first number being greater than the second number.

4. The method of claim 3, further comprising extracting a plurality of signal values from the at least one digital waveform based on the plurality of input signal characteristics.

5. The method of claim 4, further comprising encoding the at least one digital waveform based on the plurality of input signal characteristics.

6. The method of claim 5, further wherein the encoding of the at least one digital waveform based on the plurality of input signal characteristics comprises modulating the at least one digital waveform according to a plurality of modulation algorithms, each of the plurality of modulation algorithms being associated with one of the plurality of input signals.

7. The method of claim 6, wherein the extracting the plurality of signal values from the at least one of the digital waveform comprises demodulating the at least one digital waveform according to a plurality of demodulation algorithms, each of the demodulation algorithms being associated with one of the modulation algorithms.

8. The method of claim 7, further comprising receiving a plurality of selection signals from a user input device, each of the plurality of selection signals being representative of one of the plurality of input signal characteristics.

9. The method of claim 2, wherein the plurality of input signals from the avionics systems devices are received through generic interfaces.

10. A method for processing a plurality of input signals comprising:
    receiving a plurality of selection signals from a user, each of the plurality of selection signals being representative of one of a plurality of input signal characteristics, each of the input signal characteristics being associated with one of the plurality of input signals;
    converting the plurality of input signals into at least one digital waveform having a plurality of the input signal characteristics; and
    extracting a plurality of signal values from the at least one digital waveform based on the plurality of input signal characteristics.

11. The method of claim 10, wherein the plurality of input signals are each generated by an avionics system device and at least some of the plurality of input signals are analog input signals.

12. The method of claim 11, wherein the plurality of input signals comprise a first number of input signals and the converting of the plurality of input signals into the at least one digital waveform comprises multiplexing the plurality of input signals into a second number of digital waveforms, the first number being greater than the second number.

13. The method of claim 12, further comprising:
    extracting a plurality of signal values from the at least one digital waveform based on the plurality of input signal characteristics; and
    encoding the at least one digital waveform based on the plurality of input signal characteristics.

14. The method of claim 13, wherein the encoding the at least one digital waveform based on the plurality of input signal characteristics comprises modulating the at least one digital waveform according to a plurality of modulation algorithms, each of the plurality of modulation algorithms being associated with one of the plurality of input signals.

15. The method of claim 14, wherein the extracting the plurality of signal values from the at least one of the digital waveform comprises demodulating the at least one digital waveform according to a plurality of demodulation algorithms, each of the demodulation algorithms being associated with one of the modulation algorithms.

16. The method of claim 15, further comprising receiving a plurality of selection signals from a user input device, each of the plurality of selection signals being representative of one of the plurality of input signal characteristics.

17. A machine-readable medium having a set of instructions stored thereon that when performed by a machine cause the machine to perform a method, the method comprising:
    receiving a plurality of input signal characteristics from a user, each of the plurality of input signal characteristics being associated with one of a plurality of input signals;

converting the plurality of input signals into at least one digital waveform having a plurality of the input signal characteristics and extracting a plurality of signal values from the at least one digital waveform based on said received plurality of input signal characteristics, each of the plurality of signal values being associated with one of the plurality of input signals.

18. The machine-readable medium of claim 17, wherein the method further comprises:

receiving a second plurality of input signal characteristics from the user, each of the second plurality of input signal characteristics being associated with one of a second plurality of input signals; and extracting a second plurality of signal values from a second at least one digital waveform based on said received second plurality of input signal characteristics, each of the second plurality of signal values being associated with one of the second plurality of input signals.

19. The machine-readable medium of claim 18, wherein the at least one digital waveform is generated based on the plurality of input signal characteristics and the plurality of input signals and the second at least one digital waveform is generated based on the second plurality of input signal characteristics and the second plurality of input signals.

20. The machine-readable medium of claim 19, wherein the extracting the plurality of signal values from the at least one digital waveform based on said received plurality of input signal characteristics comprises demodulating the at least one digital waveform according to a first set of demodulation algorithms, each of the first set of demodulation algorithms being associated with one of the plurality of input signals, and wherein the extracting the second plurality of signal values from the second at least one digital waveform based on said received second plurality of input signal characteristics comprises demodulating the second at least one digital waveform according to a second set of demodulation algorithms, each of the second set of demodulation algorithms being associated with one of the second plurality of input signals.

\* \* \* \* \*